(12) United States Patent
Salter et al.

(10) Patent No.: US 11,564,340 B2
(45) Date of Patent: Jan. 24, 2023

(54) SYSTEMS AND METHODS FOR AN ENCLOSURE THAT PROVIDES EMI SHIELDING AND HEAT SINKING TO AN ELECTRONIC ASSEMBLY OF A VEHICLE

(71) Applicant: Ford Global Technologies, LLC, Dearborn, MI (US)

(72) Inventors: Stuart Salter, White Lake, MI (US); Paul Kenneth Dellock, Northville, MI (US); Thomas Hermann, Troy, MI (US); Tye Winkel, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 231 days.

(21) Appl. No.: 16/951,623

(22) Filed: Nov. 18, 2020

(65) Prior Publication Data

US 2022/0159882 A1 May 19, 2022

(51) Int. Cl.
| | |
|---|---|
| *H05K 9/00* | (2006.01) |
| *H02G 3/08* | (2006.01) |
| *B60R 16/02* | (2006.01) |
| *H05K 7/20* | (2006.01) |
| *H05K 5/00* | (2006.01) |

(52) U.S. Cl.
CPC ........... *H05K 9/0045* (2013.01); *B60R 16/02* (2013.01); *H02G 3/088* (2013.01); *H05K 5/0052* (2013.01); *H05K 7/20854* (2013.01)

(58) Field of Classification Search
CPC .................................................. H05K 9/0045
See application file for complete search history.

(56) References Cited

U.S. PATENT DOCUMENTS 6,709,291 B1 * 3/2004 Wallace ............... H05K 5/0034
439/607.01
7,476,702 B2   1/2009 Sagal et al.
(Continued)

OTHER PUBLICATIONS

Sudheer Bandla, "Injection Molded Poly(ethyelene Terephthalate)-Graphene Nanocomposites", Submitted to the Faculty of the Graduate College of Oklahoma State University, May 2015, 144 pages.

*Primary Examiner* — Hung V Ngo
(74) *Attorney, Agent, or Firm* — Frank Lollo; Eversheds Sutherland (US) LLP

(57) ABSTRACT

Example embodiments described in this disclosure are generally directed to a plastic enclosure that provides EMI shielding and heat sinking to an electronic assembly. In one embodiment, the enclosure includes a housing portion formed of a base material that includes a polymer containing graphene nanostructures and carbon nanostructures. The graphene nanostructures provide a thermal conductivity characteristic to the base material. A set of standoff elements made of the base material is provided inside the housing for mounting the electronic assembly. Heat generated by the electronic assembly is conducted out of the enclosure by the standoff elements due to the graphene nanostructures. The carbon nanostructures provide an electrical conductivity characteristic to the base material. A lid formed of the base material may be attached to the housing portion. The carbon nanostructures in the housing portion and the lid provide EMI shielding to the electronic assembly inside the enclosure.

11 Claims, 6 Drawing Sheets

(56) References Cited

U.S. PATENT DOCUMENTS

| | | |
|---|---|---|
| 7,506,436 B2 | 3/2009 | Bachman |
| 9,957,360 B2 | 5/2018 | Hanan et al. |
| 2003/0213606 A1* | 11/2003 | Casper ................ H05K 9/0041 |
| | | 174/360 |
| 2012/0176755 A1* | 7/2012 | Malek ................. H05K 9/0032 |
| | | 361/752 |
| 2019/0159371 A1* | 5/2019 | Grinsteinner ......... G01S 7/4813 |

* cited by examiner

SYSTEMS AND METHODS FOR AN ENCLOSURE THAT PROVIDES EMI SHIELDING AND HEAT SINKING TO AN ELECTRONIC ASSEMBLY OF A VEHICLE

BACKGROUND

A vehicle typically includes a large number of components. Many of these components are located in enclosed areas such as an engine compartment of the vehicle. Mechanical components are generally designed to withstand various adverse conditions such as high temperature, humidity, and wetness. Electronic assemblies, such as an engine controller circuit board or a climate control circuit board, are typically housed inside an enclosure so as to prevent water and dirt from affecting the operations of these components. Some enclosures are made of metal while others are made of non-metallic materials such as ABS plastic. Metal enclosures provide certain advantages, such as strength, durability, and heat dissipation characteristics, that help in minimizing adverse effects of heat upon the electronic assembly. Metal enclosures also offer shielding and grounding features that minimize adverse effects of electromagnetic interference (EMI) radiation upon the electronic assembly from external sources, and also minimize any EMI emissions produced by the electronic assembly from being radiated out of the metal enclosure. However, metal enclosures may add weight to the vehicle and it is generally desirable to minimize weight without compromising integrity. While current good engineering practice provides shielding to minimize EMI, removing metal enclosures could decrease vehicle weight while maintaining shielding to reduce EMI interference and emissions.

It is therefore desirable to fabricate vehicle components, particularly enclosures for electronic assemblies, which are light weight, yet offer benefits such as, for example, EMI shielding, heat sinking, and moisture proofing.

BRIEF DESCRIPTION OF THE DRAWINGS

A detailed description is set forth below with reference to the accompanying drawings. The use of the same reference numerals may indicate similar or identical items. Various embodiments may utilize elements and/or components other than those illustrated in the drawings, and some elements and/or components may not be present in various embodiments. Elements and/or components in the figures are not necessarily drawn to scale. Throughout this disclosure, depending on the context, singular and plural terminology may be used interchangeably.

DETAILED DESCRIPTION

Overview

Figure 1:
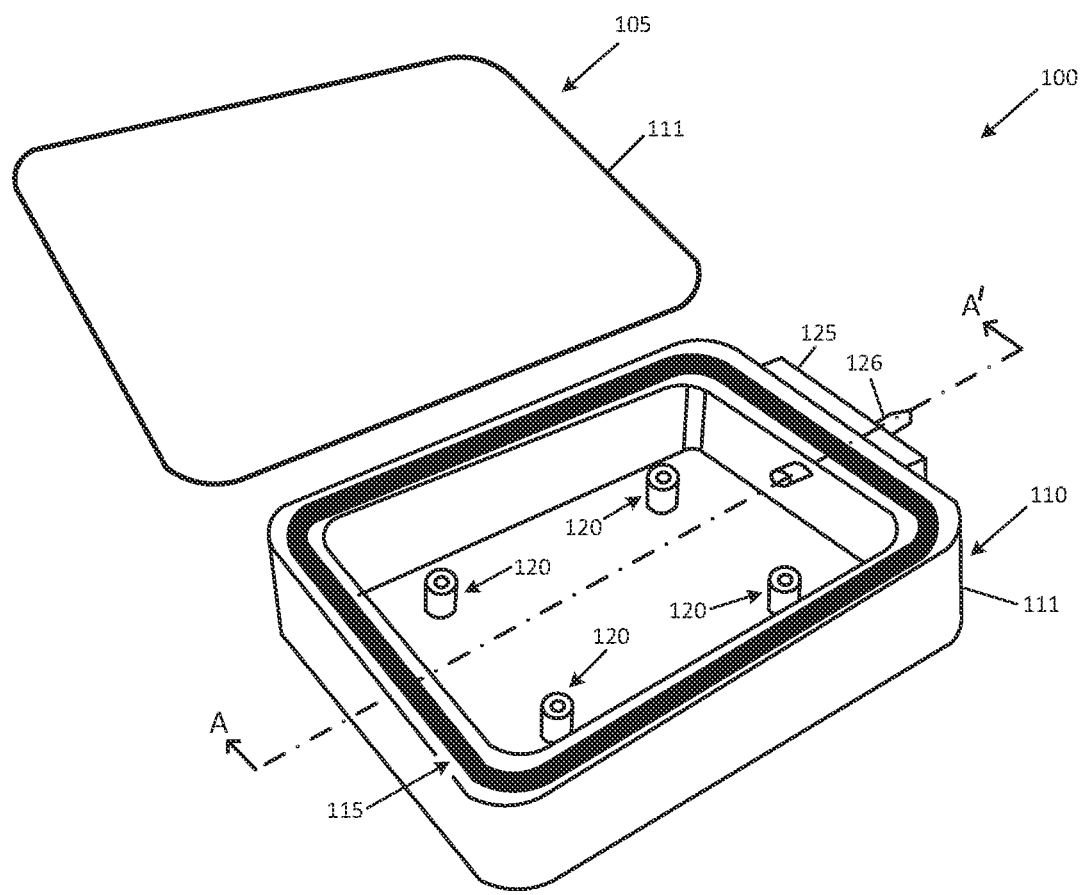
FIG. 1 shows a first example embodiment of an enclosure that provides EMI shielding and heatsinking to an electronic assembly in accordance with an embodiment of the disclosure.

In terms of a general overview, certain embodiments described in this disclosure are directed to a plastic enclosure that provides EMI shielding and heat sinking to an electronic assembly such as, for example, a printed circuit board assembly (PCBA) or an electronic module. In some instances, the enclosure includes a housing portion formed of a base material that can be a polymer containing graphene nanostructures and carbon nanostructures. The graphene nanostructures provide a thermal conductivity characteristic to the base material and the carbon nanostructures provide an electrical conductivity characteristic to the base material. A set of standoff elements made of the base material may be provided inside the housing for mounting the electronic assembly. Heat generated by the electronic assembly is conducted out of the enclosure by the standoff elements, due to the graphene nanostructures contained therein. A lid formed of the base material may be attached to the housing portion. The carbon nanostructures in the housing portion and the lid provide EMI shielding to the electronic assembly inside the enclosure.

In certain embodiments, a sheathing material may be applied over the base material. The sheathing material may be a polymer that has waterproofing characteristics and protects the electronic assembly from moisture that may be present outside the enclosure. In an example application, the enclosure is used to house a PCBA and may be installed in a vehicle such as, for example, in an engine compartment of the vehicle. The engine compartment is typically an environment that includes heat generated by an engine of the vehicle and moisture (as a result of water sprayed upwards from a road surface after a rain). In this embodiment, the base material offers EMI shielding and heatsinking while the sheathing material offers waterproofing characteristics to the enclosure.

Illustrative Embodiments

The disclosure will be described more fully hereinafter with reference to the accompanying drawings, in which example embodiments of the disclosure are shown. This disclosure may, however, be embodied in many different forms and should not be construed as limited to the example embodiments set forth herein. It will be apparent to persons skilled in the relevant art that various changes in form and detail can be made to various embodiments without departing from the spirit and scope of the present disclosure. Thus, the breadth and scope of the present disclosure should not be limited by any of the above-described example embodiments but should be defined only in accordance with the following claims and their equivalents. The description below has been presented for the purposes of illustration and is not intended to be exhaustive or to be limited to the precise form disclosed. It should be understood that alternate implementations may be used in any combination desired to form additional hybrid implementations of the present disclosure. For example, any of the functionality described with respect to a particular device or component may be performed by another device or component. Furthermore, while specific device characteristics have been described, embodiments of the disclosure may relate to numerous other device characteristics. Further, although embodiments have been described in language specific to structural features and/or methodological acts, it is to be understood that the disclosure is not necessarily limited to the specific features or acts described. Rather, the specific features and acts are disclosed as illustrative forms of implementing the embodiments.

Certain words and phrases are used herein solely for convenience and such words and terms should be interpreted as referring to various objects and actions that are generally understood in various forms and equivalencies by persons of ordinary skill in the art. It should also be understood that the word "example" as used herein is intended to be non-exclusionary and non-limiting in nature. The phrase "base material" as used herein generally refers to a type of polymer that includes a combination of an electrically conductive material and a thermally conductive material. The base material may be overcoated with a sheathing material in some embodiments. The phrase "sheathing material" as used herein generally refers to a type of polymer that has various characteristics and more particularly includes a waterproofing characteristic. The word "vehicle" as used herein with reference to some example embodiments can pertain to any one of various types of vehicles such as cars, vans, sports utility vehicles, trucks, electric vehicles, gasoline vehicles, hybrid vehicles, and autonomous vehicles. The word may also be equally applicable to other types of vehicles such as, for example, planes, trains, and water craft.

FIG. 1 shows a first example embodiment of a plastic enclosure 100 that provides EMI shielding and heat sinking to an electronic assembly (not shown) in accordance with an embodiment of the disclosure. The plastic enclosure 100 may be used in a wide variety of applications such as, for example, in communications equipment, military equipment, civilian equipment, and consumer electronic devices, and may be installed in various types of transport (ships, planes, trains, automobiles, etc.). The electronic assembly can be any of various types of components such as, for example, a printed circuit board assembly (PCBA), an electronic assembly, and/or an electronic module. It should be understood that the plastic enclosure 100 may be configured to house an electronic assembly in some applications but may be alternatively configured to house any other type of component. For example, in another scenario, the plastic enclosure 100 may be configured to house a mechanical component.

In one example implementation, the plastic enclosure 100 may be mounted in an engine compartment of a vehicle and houses one or more electronic assemblies such as, for example, an engine controller circuit board or a climate control circuit board. In another example application, the plastic enclosure 100 may be mounted in an engine compartment of a vehicle and configured and houses a mechanical component.

The plastic enclosure 100 may be fabricated in various ways using various types of materials. In one example implementation, the plastic enclosure 100 may be fabricated by executing a single-shot molding procedure upon a base material 111. The base material 111 may be a polymer that provides a combination of an electrically conductive characteristic and a thermally conductive characteristic. In another example implementation, the plastic enclosure 100 may be fabricated by executing a two-shot molding procedure upon the base material 111 and a sheathing material. The two-shot molding procedure may be executed by molding the base material 111, followed by overmolding the sheathing material upon the base material 111.

Polymers, particularly synthetic polymers such as plastic, nylon, and Teflon® are typically poor conductors of electricity but do provide some level of thermal insulation. For example, nylon can operate as an electrical insulator due to a high surface resistivity and volume resistivity (each about $10^{16}$ ohms/cm). Some thermoplastics provide poor thermal conductivity and can therefore operate as thermal insulators. For example, the thermal conductivity of one type of polymer is about 0.25 W/m·K. This type of material can be used where thermal insulation is desired.

The base material 111 used to form the plastic enclosure 100 can be a base polymer that has been modified to provide an electrically conductive characteristic as well as a thermally conductive characteristic. The base polymer may be any of various types of polymers such as, for example, polybutylene terephthalate (PBT), polypropylene, or polyethylene. The introduction of the carbon material into the base polymer endows the base polymer with an electrical conductivity characteristic that allows for propagation of an electrical current through the modified base polymer. The introduction of the graphite material into the base polymer endows the base polymer with a thermal conductivity characteristic that allows for heat transfer through the modified base polymer.

The magnitude of the electrical current that is propagated through the modified base polymer (the base material 111) may be adjusted based on the amount of carbon material introduced into the base polymer. A larger amount of carbon material allows for higher electrical conductivity and vice-versa. The amount of heat transfer that takes place through the modified base polymer may be adjusted based on the amount of graphite introduced into the base polymer. A larger amount of graphite allows for greater heat transfer through the modified base polymer and vice-versa.

The combination of high electrical current conductivity and high thermal conductivity provided by the base material 111 can be used in various applications where such a combination is desirable. In one example application in accordance with the disclosure, the base material 111 can be used to conduct electro-magnetic interference (EMI) currents to ground and to conduct heat away from an object. The EMI currents may be generated due to EMI radiation from an electronic circuit assembly that is located close to, or in contact with, the base material 111. The high thermal conductivity of the base material 111 can be used to conduct heat away from an electronic circuit assembly located close to, or placed in contact with, the base material 111.

In an example embodiment in accordance with the disclosure, the base material 111 is formulated by introducing a specified quantity of graphene nanostructures and a specified quantity of carbon nanostructures into a base polymer such as, for example, low-density polyethylene, low-density polypropylene, polyethylene terephthalate (PET), polybutylene terephthalate (PBT), and/or polyether ether ketone (PEEK).

It may be desirable to use a single graphene nanostructure layer in some applications in accordance with the disclosure so as to obtain a high level of operational performance. However, cost considerations may dictate the use of more than one graphene nanostructure layer, such as, for example, 2 to 4 layers. A commercially available version of graphene known as GrapheneBlack™ (manufactured by NanoXplore®) may average about 8 to 10 graphene nanostructure layers.

In some applications in accordance with the disclosure, graphene nanostructures layers may be produced in the form of exfoliated graphite nano-platelets (xGnP), by exfoliating natural graphene (rather than synthetic graphene). The exfoliated graphite nano-platelets may range in size from about 1 micrometer to about 100 micrometers in diameter and the number of layers may range from about 3 layers to about 50 layers.

The carbon nanostructures that are introduced into the base polymer in order to formulate the base material 111 can be provided in various forms. In an example application, a commercially available version of carbon nanostructures known as ATHLOS™ carbon nanostructures (developed by Lockheed Martin® and marketed by Cabot®) may be used. The manufacturing process for the carbon nanostructures may include the use of a catalyst to grow single wall carbon nano-tubes on a substrate such as glass fibers or glass spheres. The resulting product has a unique morphology of cross linked and branched carbon nanotubes that branch out in the form of layers of highly conductive electrical pathways. The highly conductive electrical pathways are formed by the carbon platelets of the carbon layers linking with the graphene platelets of the graphene layers.

The example plastic enclosure 100 shown in FIG. 1, includes a housing portion 110 and a lid 105. In one example implementation, the housing portion 110 may be fabricated by executing a single-shot molding procedure upon the base material 111. In another example implementation, the housing portion 110 may be fabricated by executing a two-shot molding procedure that includes molding the base material 111 to conform to a first shape of the housing portion 110 and overmolding the sheathing material upon the base material 111. The lid 105 may be similarly fabricated by either using the base material 111 in a single-shot molding procedure or using a combination of the base material 111 and the sheathing material in a two-shot molding procedure.

A seal 115 may be provided upon an entirety of a rim of the housing portion 110. In an example embodiment, the seal 115 is fabricated by executing a single shot molding procedure upon a polymer that is compressible and has a waterproofing characteristic. In an example implementation of this embodiment, the seal 115 can be fabricated by executing a single shot molding procedure upon a material such as a thermoplastic elastomer (TPE), a thermoplastic polyurethane (TPU), a thermoplastic vulcanizate (TPV), and/or some other types of flexible materials. In another example implementation, the seal 115 may be fabricated from a metal (a braided metal gasket, for example), an electrically conductive foam material, and/or an electrically conductive rubber compound. The seal 115 may be held in place on the rim by any of various ways such as, for example, by application of an adhesive and/or by placement of the seal 115 in a channel or gutter provided on the rim.

The lid 105 may be attached to the housing portion 110 by placing the lid 105 upon the seal 115 and using any of various attachment elements such as, for example, a set of screws, clamps, and/or an adhesive. The screws and/or clamps may be operated to move the lid 105 towards the rim of the housing portion 110. Moving the lid 105 towards the rim of the housing portion 110 causes the seal 115 to compress and form a watertight seal that prevents water or moisture from entering an interior section of the housing portion 110 where the PCBA is mounted.

The interior section of the housing portion 110 can include any of various types of mounting members for mounting an electronic assembly (or any other type of assembly). In this example embodiment, an electronic assembly (not shown) such as, for example, a printed circuit board assembly (PCBA), may be mounted upon a set of standoff elements 120 provided on a base surface of the housing portion 110. Four standoff elements 120 are illustrated in this example implementation. However, in other implementations, fewer than, or greater than, four standoff elements may be provided. Each of the standoff elements 120 is an integrally molded part of the housing portion 110 and formed during the single-shot molding of the housing portion 110. As such, each of the standoff elements 120 contains the same base material 111 as present in the housing portion 110. The presence of the carbon nanostructures and the graphene nanostructures in the base material 111 render each of the standoff elements 120 electrically conductive as well as thermally conductive.

The housing portion 110 may also include a connector 125 that can include one or more connector pins such as, for example, a connector pin 126. In a typical application, the connector 125 may include multiple pins that provide, for example, signal connections and power supply connections to the PCBA mounted upon the standoff elements 120. Other types of connectors and other types of connector pins may be provided in other embodiments.

Figure 2:
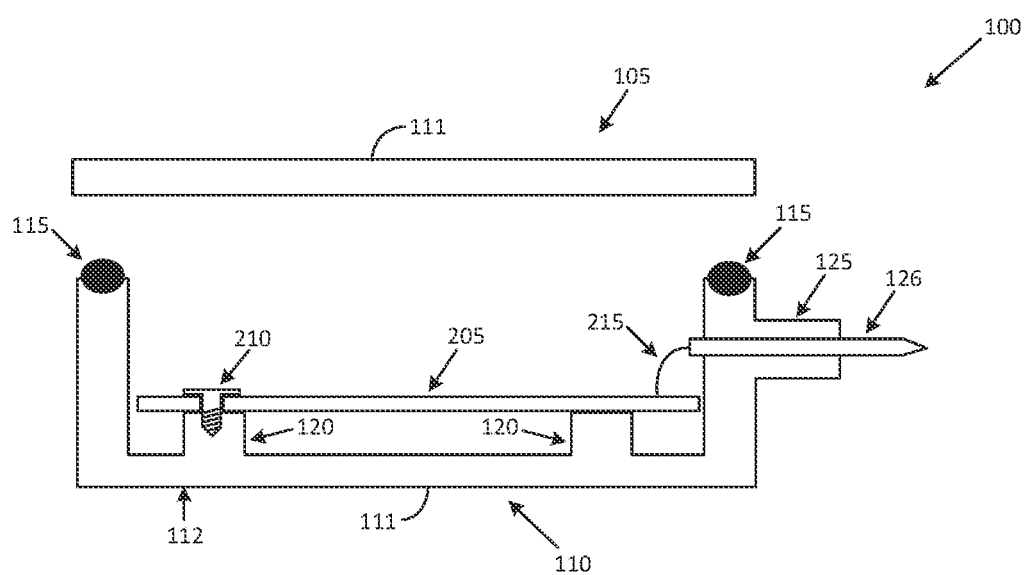
FIG. 2 shows a cut-away view of a first example implementation of the plastic enclosure illustrated in FIG. 1.

FIG. 2 shows a cut-away view of a first example implementation of the plastic enclosure 100 along the axis A-A' that is illustrated in FIG. 1. This first example implementation involves fabricating each of the housing portion 110 and the lid 105 by employing a single-shot molding procedure upon the base material 111 in accordance with the disclosure. The sheathing material is not used in this implementation. A set of screws, (such as, for example, a metal screw 210) may be used to anchor a PCBA 205 upon the set of standoff elements 120. The PCBA 205 may include a ground layer on a top surface and/or a bottom surface of the PCBA 205 where the metal screw 210 (and one or more other such screws) makes contract with the PCBA 205. When anchored upon the set of standoff elements 120, an electrical current path is formed between the metal screw 210, the ground layer of the PCBA 205, and the base material 111 of the housing portion 110.

A bottom major surface 112 of the housing portion 110 may be placed in contact with a ground plane (a metal chassis of a vehicle, for example), in order to provide grounding to the ground layer of the PCBA 205. Undesirable electrical currents (such as those caused by EMI) that may be present in the PCBA 205, are effectively grounded, thereby protecting the PCBA 205 from adverse EMI effects. The electrical conductivity characteristic of the base material 111 of the plastic enclosure 100 is selected to provide such EMI shielding capabilities.

Attaching the lid 105 to the housing portion 110 creates an enclosed interior section where the PCBA 205 is located. The enclosed interior section may operate as a Faraday cage, thereby minimizing or eliminating the effects of EMI upon the PCBA 205 and can also minimize or eliminate any EMI that may be generated in the PCBA 205 from radiating out of the plastic enclosure 100.

The plastic enclosure 100 also operates as a heat sink that conveys away at least a portion of heat that may be generated by the PCBA 205. The heat can be conducted from the PCBA 205 and out of the plastic enclosure 100 via the set of standoff elements and the housing portion 110. Heat radiated by the PCBA 205 may also be conducted through the plastic enclosure 100 and away from the PCBA 205. The thermal conductivity characteristic of the base material 111 of the plastic enclosure 100 is selected to provide such heat sinking capabilities.

In this example implementation, the connector 125 is an integral part of the plastic enclosure 100 and is fabricated as a part of the housing portion 110 during the single-shot molding procedure. The connector pin 126 may be connected to the PCBA 205 in various ways such as, for example, by a wire 215, or by soldering the connector pin 126 directly to the PCBA 205.

Figure 3:
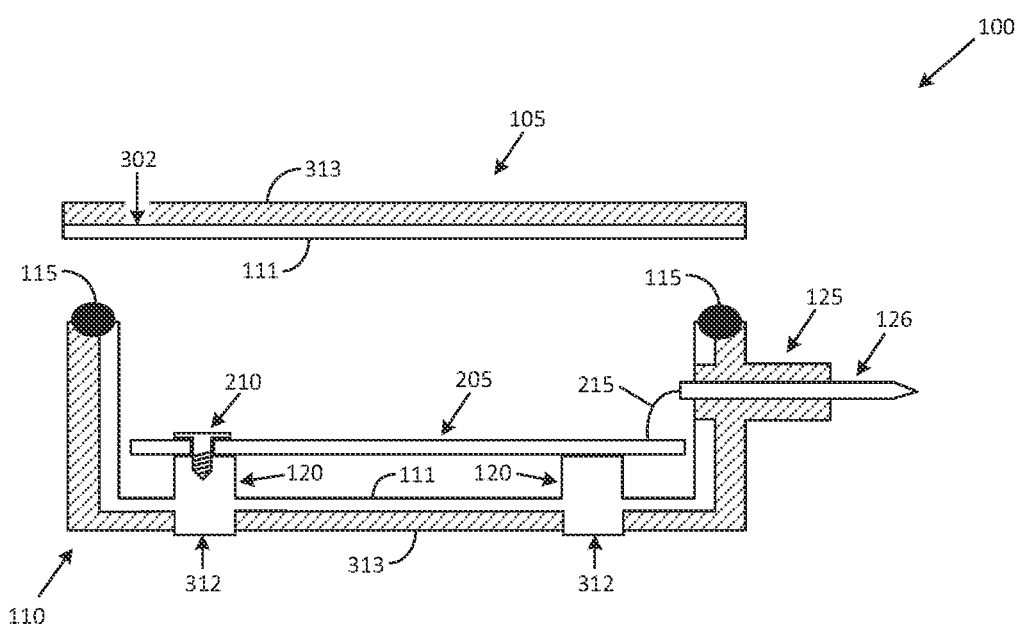
FIG. 3 shows a cut-away view of a second example implementation of the plastic enclosure illustrated in FIG. 1.

FIG. 3 shows a cut-away view of a second example implementation of the plastic enclosure 100 along the axis A-A' that is illustrated in FIG. 1. This second example implementation involves fabricating each of the housing portion 110 and the lid 105 by employing a two-shot molding procedure upon the base material 111 and the sheathing material 313. The sheathing material 313 is illustrated in a hatched format. The two-shot molding procedure may be executed by molding the base material 111 to conform to a shape of the housing portion 110, followed by overmolding the sheathing material 313 upon the base material 111. The housing portion 110 in this embodiment may be fabricated by molding the base material 111 to conform to a second shape of the housing portion 110 that is different than the first shape described above with reference to FIG. 2. The lid 105 may be fabricated by molding the base material 111 to conform to a shape of the lid 105 (a rectangular shape, in this example), followed by overmolding the sheathing material 313 upon an upper major surface 302 of the base material 111.

The housing portion 110 in this embodiment includes a portion of some, or all, of the standoff elements 120 extending through the sheathing material 313 and being exposed to outside elements. In this configuration, a bottom surface 312 of each standoff element 120 may be placed in contact with a surface such as, for example, a chassis of a vehicle. Heat that may be generated by the PCBA 205 is conducted through the ground layer of the PCBA 205 that is in contact with the standoff element 120 and is conveyed into the chassis of the vehicle. EMI currents, if any, may also be conducted through the standoff elements 120 and into the chassis of the vehicle.

The connector 125 is an integral part of the plastic enclosure 100 and is fabricated as a part of the housing portion 110 during the two-shot molding procedure. The connector pin 126 in this implementation, is encased inside the sheathing material 313. In some instances, a seal around the pin 126 may be inserted after the plastic enclosure 100 is fabricated. In other instances, the seal could be molded around the pin 126 in a soft nonconductive plastic or the like. The sheathing material 313 may be selected to provide waterproofing and may be further selected to be an electrical insulator. The electrical insulating characteristic of the sheathing material 313 allows multiple connector pins to be provided in the connector 125 without causing electrical shorts between the connector pins.

Figure 4:
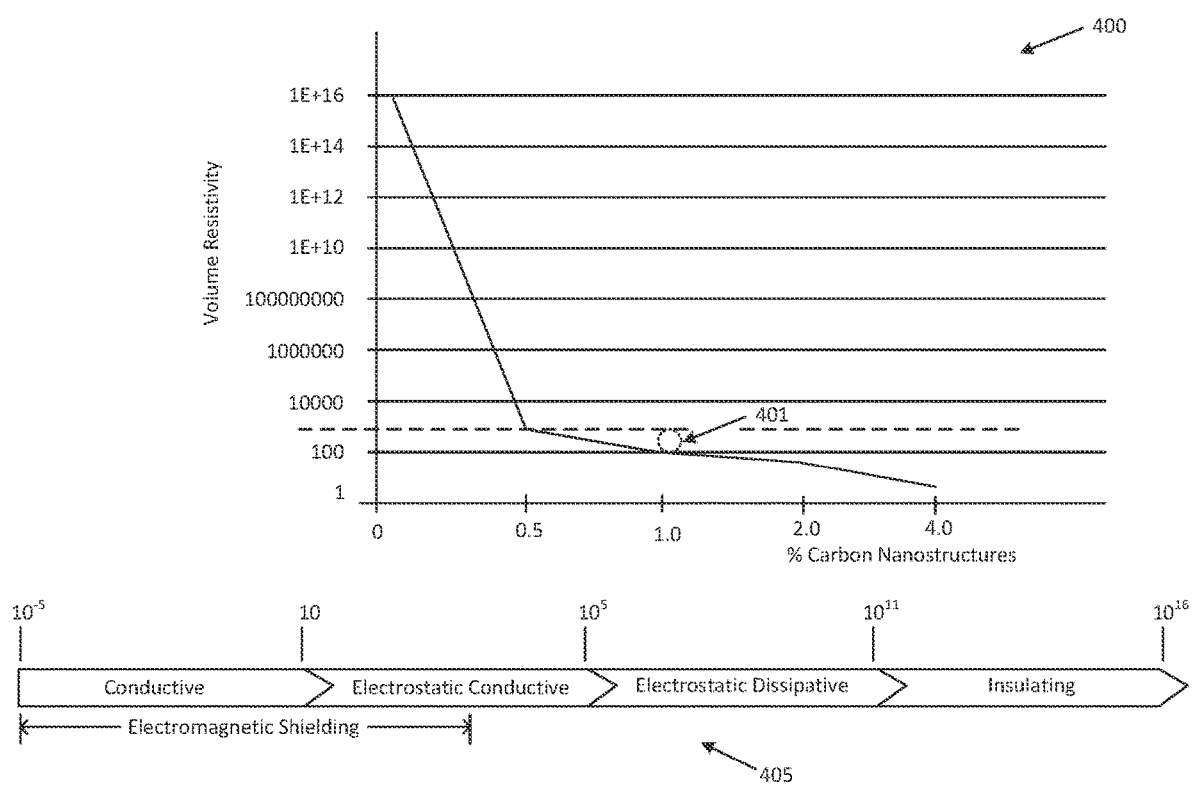
FIG. 4 illustrates an example graph that characterizes certain materials that may be used for fabricating a plastic enclosure in accordance with the disclosure.

FIG. 4 illustrates an example graph 400 that characterizes certain materials that may be used for fabricating the plastic enclosure 100 in accordance with the disclosure. The y-axis of the example graph 400 indicates volume resistivity of a base material. The x-axis indicates a percentage amount of carbon nanostructures in the base material. A graphic 405 that is shown below the graph 400 pertains to various characteristics of a base material that vary in accordance with resistivity. The resistivity may be varied by introducing various amounts of carbon nanostructures into the base material. In terms of characteristics, the graphic 405 indicates that a material having a resistivity less than 1000 ohm-cm may be considered suitable for electromagnetic shielding.

With reference to the graph 400, it can be understood that a base material containing 0.5% carbon nanostructures has about 800 ohm-cm resistivity and may be suitable for electrostatic shielding applications. A base material containing 2% carbon nanostructures has about 36 ohm-cm resistivity and may be used for low temperature heating applications. A base material containing 4% carbon nanostructures has about 3.9 ohm-cm resistivity and may be used for low power electrical bus applications.

In an example implementation in accordance with the disclosure the base material 111 described herein with reference to various example embodiments, can be a polyethylene terephthalate (PET) base material containing a combination of 12% exfoliated graphene nanostructures and 1% carbon nanostructures. The base material 111 with such a composition offers a volume resistivity of about 100 ohm-cm (as indicated by the dashed circle 401). More generally, the first quantity of carbon nanostructures introduced into the base material may range from about 0.5% to about 4% of the first polymer (such as PET), and the first quantity of graphene nanostructures (or exfoliated graphite) may range from about 1% to about 20% of the first polymer.

Figure 5:
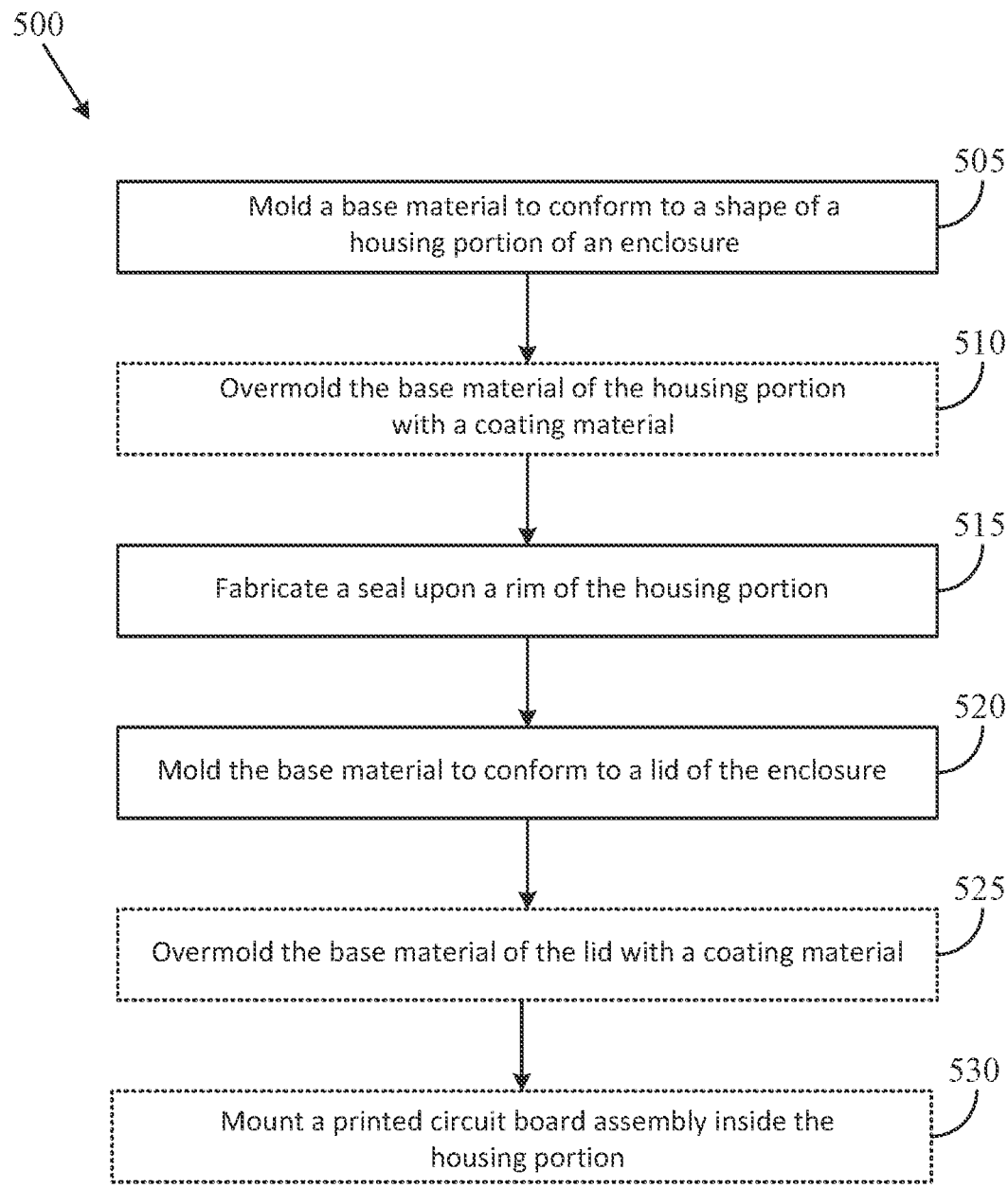
FIG. 5 shows a flowchart of an example method for fabricating a plastic enclosure in accordance with an embodiment of the disclosure.

FIG. 5 shows a flowchart 500 of an example method for fabricating the plastic enclosure 100 in accordance with an embodiment of the disclosure. The order of operations indicated in the flowchart 500 is not intended to be construed as a limitation, and any number of the described operations may be carried out in a different order, omitted, combined in any order, and/or carried out in parallel. The description below may make reference to certain components and objects shown in FIGS. 1-3, but it should be understood that this is done for purposes of explaining certain aspects of the disclosure and that the description is equally applicable to many other embodiments in accordance with the disclosure.

Figure 6:
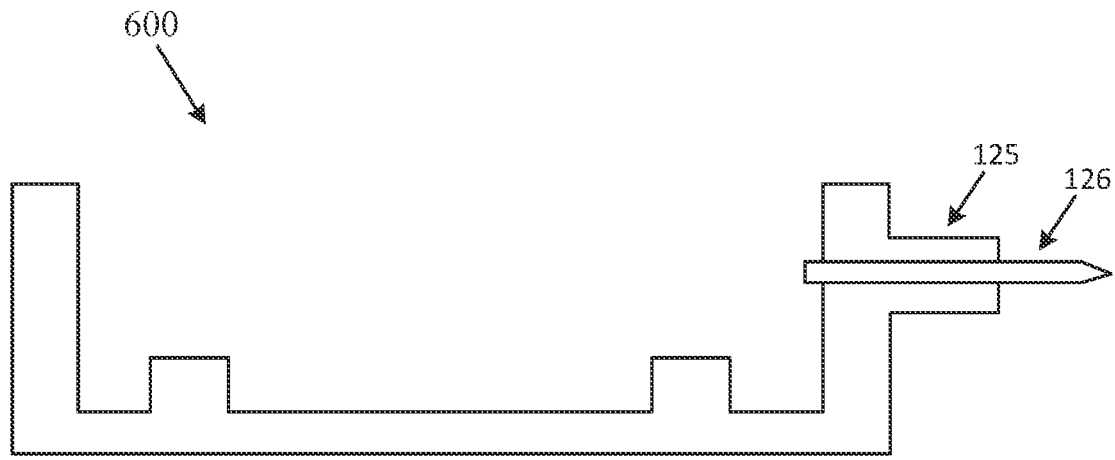
FIG. 6 shows a cut-away of an example implementation of the plastic enclosure in accordance with an embodiment of the disclosure.

At block 505, a base material, such as, for example, the base material 111, is molded to conform to a shape of the housing portion 110. The shape of the housing portion 110 may vary based on the type of application for which the plastic enclosure 100 is used and also based on a material composition of the housing portion 110. As described above, the housing portion 110 in one example implementation (illustrated in FIG. 2) is fabricated entirely of the base material in a single-shot molding procedure that does not include overcoating. The shape of the housing portion 110 in this first implementation can conform to the shape 600 shown in FIG. 6.

Figure 7:
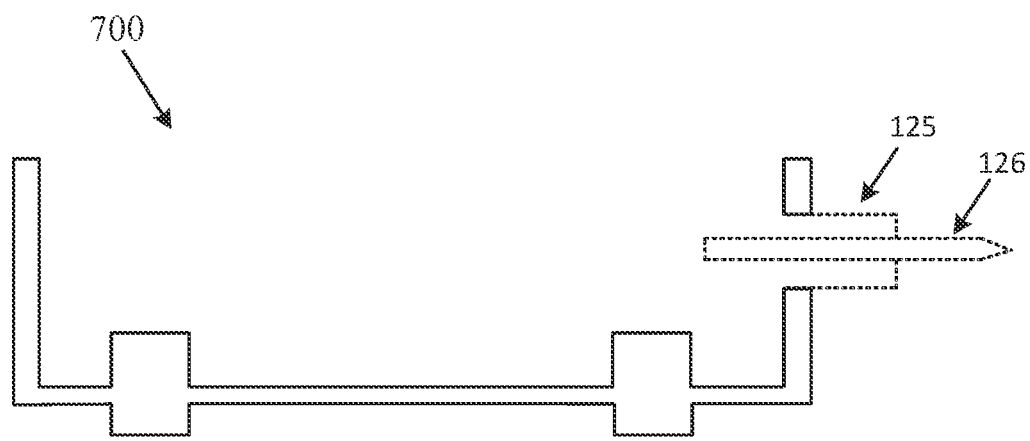
FIG. 7 shows a cut-away of an example implementation of the plastic enclosure in accordance with an embodiment of the disclosure.

The housing portion 110 in another example implementation (illustrated in FIG. 3) is fabricated using a combination of the base material 111 and the sheathing material 313 in a two-shot molding procedure where the sheathing material is applied as an overcoat to the base material. The shape of the housing portion 110 in this second implementation can conform to the shape 700 shown in FIG. 7.

At block 510, which can be eliminated when executing a single-shot molding procedure where the sheathing material is not used, the base material that is molded to conform to the shape of the housing portion 110 is overmolded with the sheathing material.

At block 515, a seal, such as, for example, the seal 115 described above, is fabricated upon a rim of the housing portion 110.

At block 520, a lid, such as, for example, the lid 105, is fabricated. The fabrication may involve molding the base material to conform a shape of the lid, which in the case of the lid 105 is a rectangular shape.

At block 525, which can be eliminated when executing a single-shot molding procedure where the sheathing material is not used, the base material that is molded to conform to the shape of the lid 105 is overmolded with the sheathing material.

At block 530, which is an optional step, a PCBA, such as, for example, the PCBA 205, may be mounted upon the standoff elements 120 inside the housing portion 110 of the plastic enclosure 100. This step may include operating one or more screws, such as, for example, the metal screw 210 and may also involve providing a connection between the connector pin 126 and the PCBA 205 (such as, by soldering a wire 215).

In addition to providing thermal and electrical benefits, the plastic enclosure 100 can offer various mechanical benefits and cost benefits. For example, the plastic enclosure 100 can have a lower weight and a lower manufacturing cost in comparison to a metal enclosure, and can also have a complex shape that conforms to various space limitations in a vehicle. For example, the plastic enclosure 100 can have a complex shape to accommodate mounting of various types of PCBAs and other components in a confined portion of an engine compartment or chassis of a vehicle.

In the above disclosure, reference has been made to the accompanying drawings, which form a part hereof, which illustrate specific implementations in which the present disclosure may be practiced. It is understood that other implementations may be utilized, and structural changes may be made without departing from the scope of the present disclosure. References in the specification to "one embodiment," "an embodiment," "an example embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, one skilled in the art will recognize such feature, structure, or characteristic in connection with other embodiments whether or not explicitly described.

While various embodiments of the present disclosure have been described above, it should be understood that they have been presented by way of example only, and not limitation. It will be apparent to persons skilled in the relevant art that various changes in form and detail can be made therein without departing from the spirit and scope of the present disclosure. Thus, the breadth and scope of the present disclosure should not be limited by any of the above-described example embodiments but should be defined only in accordance with the following claims and their equivalents. The foregoing description has been presented for the purposes of illustration and description. It is not intended to be exhaustive or to limit the present disclosure to the precise form disclosed. Many modifications and variations are possible in light of the above teaching. Further, it should be noted that any or all of the aforementioned alternate implementations may be used in any combination desired to form additional hybrid implementations of the present disclosure. For example, any of the functionality described with respect to a particular device or component may be performed by another device or component. Further, while specific device characteristics have been described, embodiments of the disclosure may relate to numerous other device characteristics. Further, although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments may not include, certain features, elements, and/or steps. Thus, such conditional language is not generally intended to imply that features, elements, and/or steps are in any way required for one or more embodiments.

That which is claimed is:

1. An enclosure for an electronic assembly of a vehicle, the enclosure comprising:
    a housing portion formed of a base material that is overlaid with a sheathing material, the base material comprising a first polymer that includes a first quantity of graphene nanostructures and a first quantity of carbon nano structures, the first quantity of graphene nanostructures providing a first thermal conductivity characteristic to the base material, the first quantity of carbon nanostructures providing a first electrical conductivity characteristic to the base material, the sheathing material comprising a second polymer that provides a waterproofing characteristic to the sheathing material; and
    a lid that is attachable to the housing portion, the lid formed of the base material overlaid with the sheathing material.

2. The enclosure of claim 1, further comprising:
    a seal located upon an entirety of a rim of the housing portion, the seal comprising one of a third polymer or a braided metal gasket having a compressible characteristic that provides a watertight seal between the housing portion and the lid.

3. The enclosure of claim 1, wherein the first polymer comprises polyethylene terephthalate (PET).

4. The enclosure of claim 3, wherein the first quantity of graphene nanostructures ranges from about 0.5% to about 4% of the first polymer, and wherein the first quantity of carbon nanostructures ranges from about 1% to about 20% of the first polymer.

5. The enclosure of claim 1, further comprising:
    a standoff element formed of the base material as an integrally molded part of the housing portion.

6. The enclosure of claim 5, further comprising:
    a printed circuit board assembly (PCBA) mounted inside the housing portion of the enclosure, the PCBA having a metal plane that is in contact with the standoff element in a ground path arrangement.

7. An enclosure for an electronic module, the enclosure comprising:
    a housing portion formed of a base material comprising a first polymer that includes a first quantity of carbon and a first quantity of graphite, the first quantity of carbon providing a first electrical conductivity characteristic to the base material, the first quantity of graphite providing a first thermal conductivity characteristic to the base material;
    a lid that is attachable to the housing portion, the lid formed of the base material;
    a sheathing material overlaid on the base material, the sheathing material comprising a second polymer that provides a waterproofing characteristic to the sheathing material,
    wherein the first polymer is a polyethylene terephthalate (PET) compound, wherein the first quantity of graphite comprises at least one of a first quantity of graphene nano structures or a first quantity of exfoliated graphite, and wherein the first quantity of carbon comprises a first quantity of carbon nano structures.

8. The enclosure of claim 7, wherein the first quantity of carbon nano structures ranges from about 0.5% to about 4% of the first polymer, and wherein the at least one of the first quantity of graphene nano structures or the first quantity of exfoliated graphite ranges from about 1% to about 20% of the first polymer.

9. The enclosure of claim 7, further comprising:
a standoff element formed of the base material as an integrally molded part of the housing portion.

10. The enclosure of claim 9, further comprising:
a printed circuit board assembly (PCBA) mounted inside the housing portion of the enclosure, the PCBA having a metal plane that is in contact with the standoff element in a ground path arrangement.

11. The enclosure of claim 7, further comprising:
a seal located upon an entirety of a rim of the housing portion, the seal comprising one of a third polymer or a braided metal gasket having a compressible characteristic that provides a watertight seal between the housing portion and the lid.

\* \* \* \* \*